United States Patent [19]

Richmond et al.

[11] Patent Number: 5,050,042
[45] Date of Patent: Sep. 17, 1991

[54] HOUSING ASSEMBLY FOR ELECTRICAL COMPONENTS WITH WINDOW FOR VIEWING ELECTRICAL COMPONENTS, SEALING RINGS, AND SLEEVES ACCEPTING DIFFERENT SIZES OF CONDUIT

[75] Inventors: James W. Richmond, Carmel; Ronald E. Cole, Greenwood, both of Ind.

[73] Assignee: Emerson Electric Co., St. Louis, Mo.

[21] Appl. No.: 564,099

[22] Filed: Aug. 8, 1990

[51] Int. Cl.⁵ .............................................. H05K 5/06
[52] U.S. Cl. .................................. 361/395; 361/380; 361/399
[58] Field of Search .................... 174/52.1, 52.3, 70 S; 361/331, 364, 369, 380, 395, 399, 417, 419; 220/3.8, 3.94, 4.02, 4.21; 73/40, 431

[56] References Cited

U.S. PATENT DOCUMENTS

| | | | |
|---|---|---|---|
| 854,309 | 5/1907 | Reed | 174/52.1 |
| 2,477,132 | 7/1949 | Rowe | 174/52.1 |
| 4,620,061 | 10/1986 | Appleton | 220/3.8 |
| 4,751,612 | 6/1988 | Smith | 361/419 |
| 4,899,586 | 2/1990 | Koneval et al. | 73/431 |

FOREIGN PATENT DOCUMENTS

| | | | |
|---|---|---|---|
| 238443 | 8/1986 | German Democratic Rep. | 73/431 |
| 319737 | 4/1957 | Switzerland | 174/52.1 |

*Primary Examiner*—Leo P. Picard
*Assistant Examiner*—Michael W. Phillips
*Attorney, Agent, or Firm*—Robert F. Meyer

[57] ABSTRACT

A housing that includes a cup shaped member and a cover carries a printed circuit board through a plurality of posts. Openings in the housing permit lead wires to be fed to the printed circuit board. The lead wires are leak tightly sealed in the openings by way of shouldered plugs which carry the lead wires. The plugs are sealed with respect to the housing through pliable sealing rings and E-rings secure the plug axially at their shoulders. Locator tabs insure that the plugs engage the openings in a proper orientation. The cover of the housing is sealed with respect to the cup shaped member through a sealing ring carried in a groove of the cup shaped member with pressure being applied through an interference fit with the ring. A leak tight window in the housing permits viewing from the outside. The shouldered plug holding the window is sealed with respect to the housing by a sealing ring and is held axially by the plug being threaded to the housing. The housing has a hollow center post which permits passage of a cable. The center post is sealed to the housing by a sealing ring. The assembly includes an adapter that permits an opening in the housing to be receptive to conduits of two different diameters.

8 Claims, 3 Drawing Sheets

HOUSING ASSEMBLY FOR ELECTRICAL COMPONENTS WITH WINDOW FOR VIEWING ELECTRICAL COMPONENTS, SEALING RINGS, AND SLEEVES ACCEPTING DIFFERENT SIZES OF CONDUIT

BACKGROUND OF THE INVENTION

The present invention relates to a housing assembly for holding electrical components and more particularly to such a housing assembly that is particularly adapted to carrying a sensor for a detection system that detects leaks of chemical substances such as oil. Typical of such system are the ones described in U.S. Pat. Nos. 4,586,033 "Fluid Detection System" issued Apr. 29, 1986 to Raymond Andrejarich and 4,644,354 "Fluid Detector" issued Feb. 17, 1986 to R. E. Kidd. In such systems care must be taken that the electrical components of the sensing system be protected from a hostile environment. Usually the electrical components are carried in a housing having means to permit lead wires or cables from the system's controller and from the systems probe to be connected to the electrical components. The housing also has means to provide access to pipes or other conduits providing entry to areas where desired detection takes place.

Among the problems associated with such arrangements are that of maintaining leak tight seals at openings in the housing, use of materials that resist a hostile environment, providing visible access to the electrical components, and providing ease of connecting the housing to different sizes of conduits.

SUMMARY OF THE INVENTION

Accordingly there is provided a housing assembly for electrical components which in general comprises a housing including a cup shaped member having an open end and a cover closing same, a groove around the outer periphery of the cup shaped member, a sealing ring carried in the groove, a rib extending from the cover engaging the groove to form an interference fit between it and the sealing ring to form a leak tight seal between the cup shaped member and the cover, seating means carried in the cup shaped member carrying electrical components, first and second openings in the housing permitting lead wires to be fed to and from the electrical components, a third opening in the housing permitting the electrical components to be viewed from outside the housing, a hollow center post extending through the housing permitting passage of a cable, and an adapter including means permitting the housing to be connected to at least two conduits of different diameters.

DETAILED DESCRIPTION OF THE INVENTION

Figure 1:
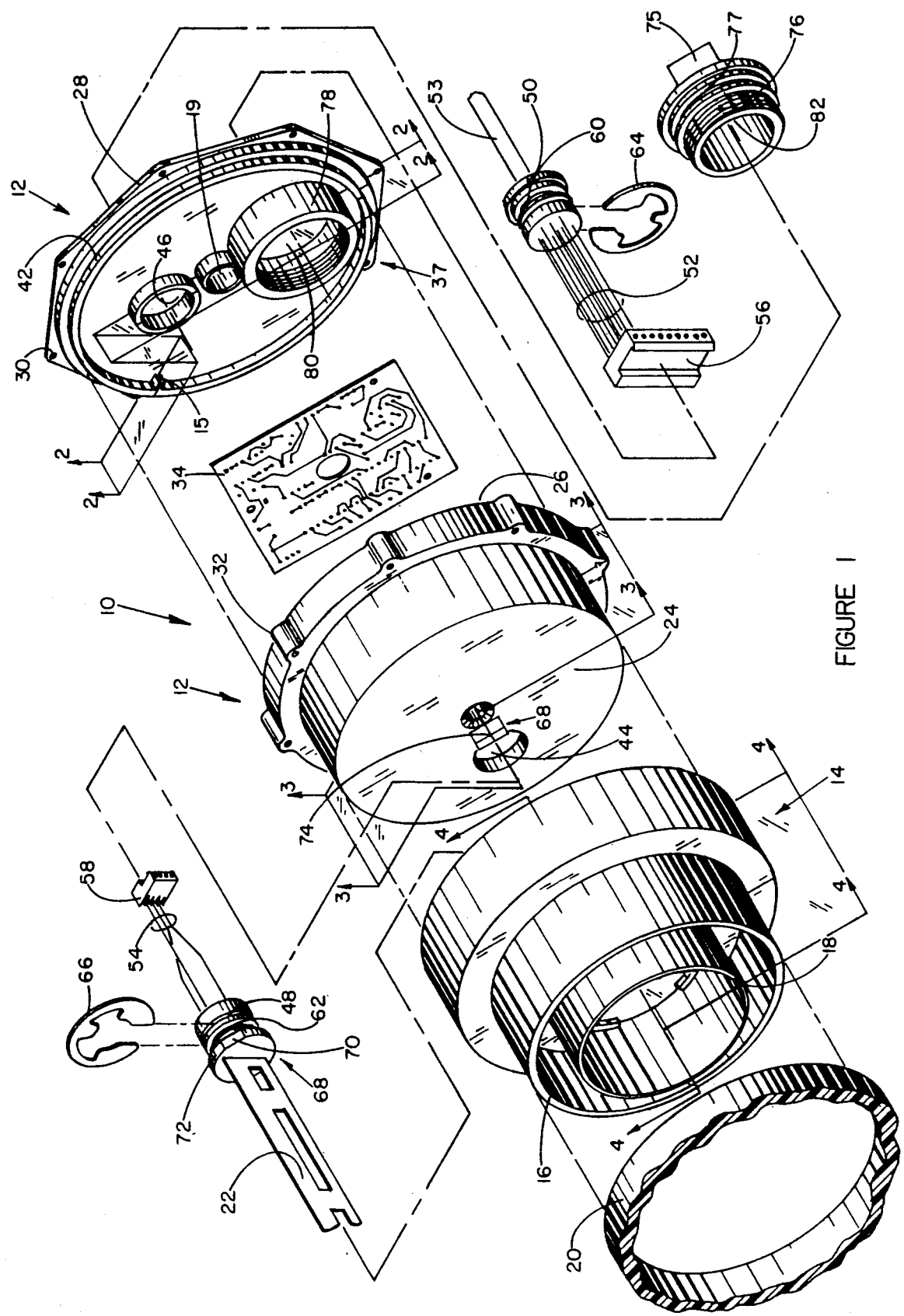
FIG. 1 is an exploded view of a housing assembly employing the invention.

Referring now to the drawings the housing assembly 10 includes a housing 12 and an adapter 14. Adapter 14 includes two sleeves 16 and 18 having two different diameters. The adapter 14 fits over housing 12. An shown in the illustrative embodiment the larger diameter 16 is adapted to fit into a conduit 20. As will be apparent, conduit 20 permits feeder lines 22 to be lowered below ground level. Such feeder lines could, as described in the afore-mentioned U.S. Pat. No. 4,644,354 carry a probe sensor to detect conditions below ground level.

Housing 12 includes a cup shaped member 24 having an open end 26 that is closed by a cover 28 that is held to the cup shaped member by screws (not shown) extending through holes 30 and threaded into holes 32. Carried within the cup shaped member are electrical components including a circuit board 34. The board is carried on seating means 36 which includes a plurality of posts 35 extending from base 23.

Figure 2:
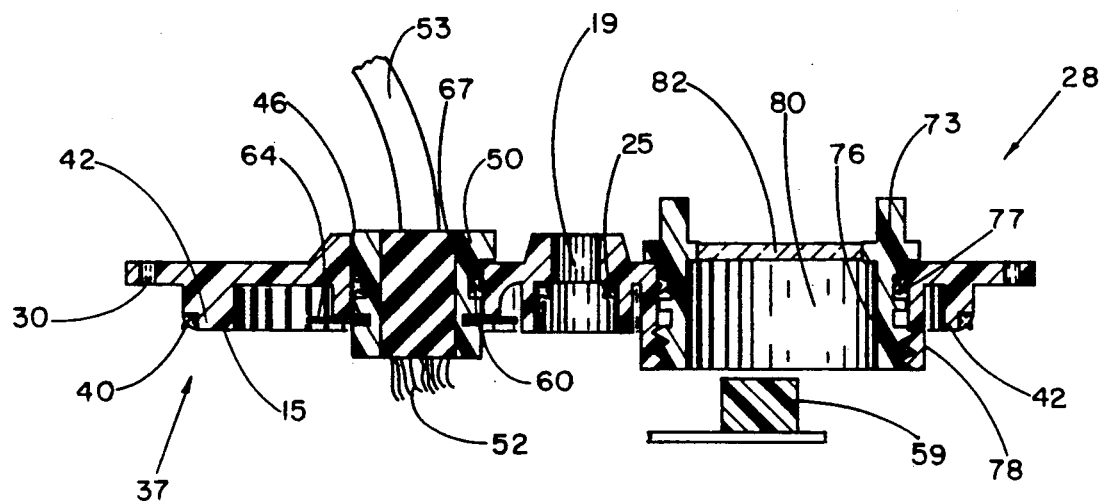
FIGS. 2 through 4 are cross sections of the housing assembly taken along the planes 2—2, 3—3, and 4—4 respectively of FIG. 1.
Figure 3:
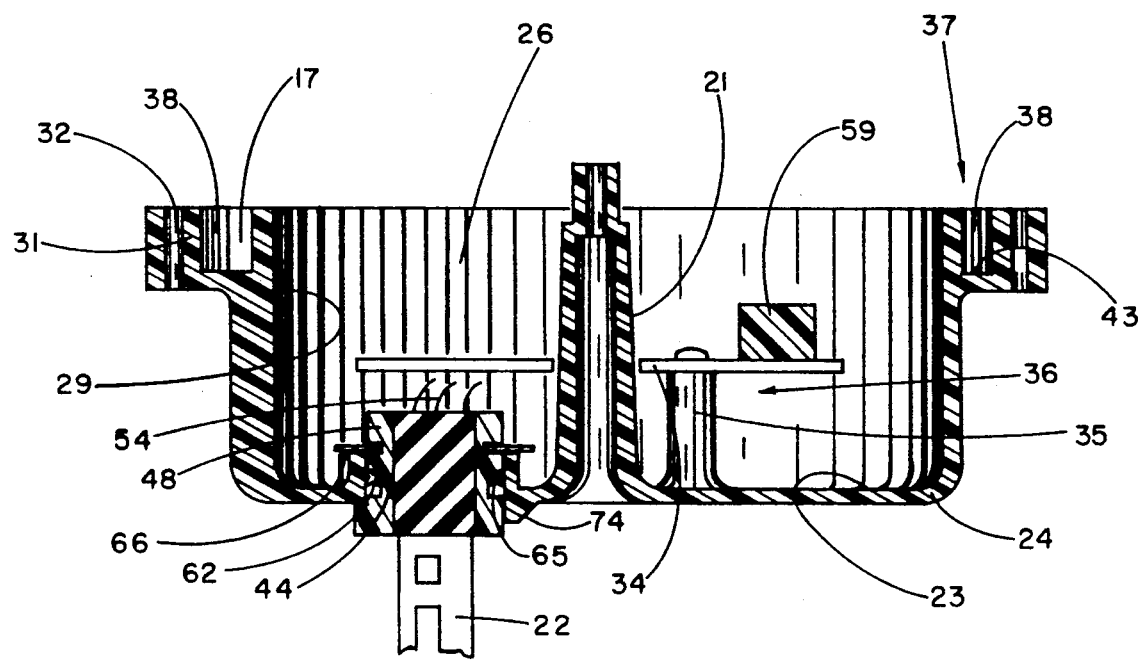
Figure 4:
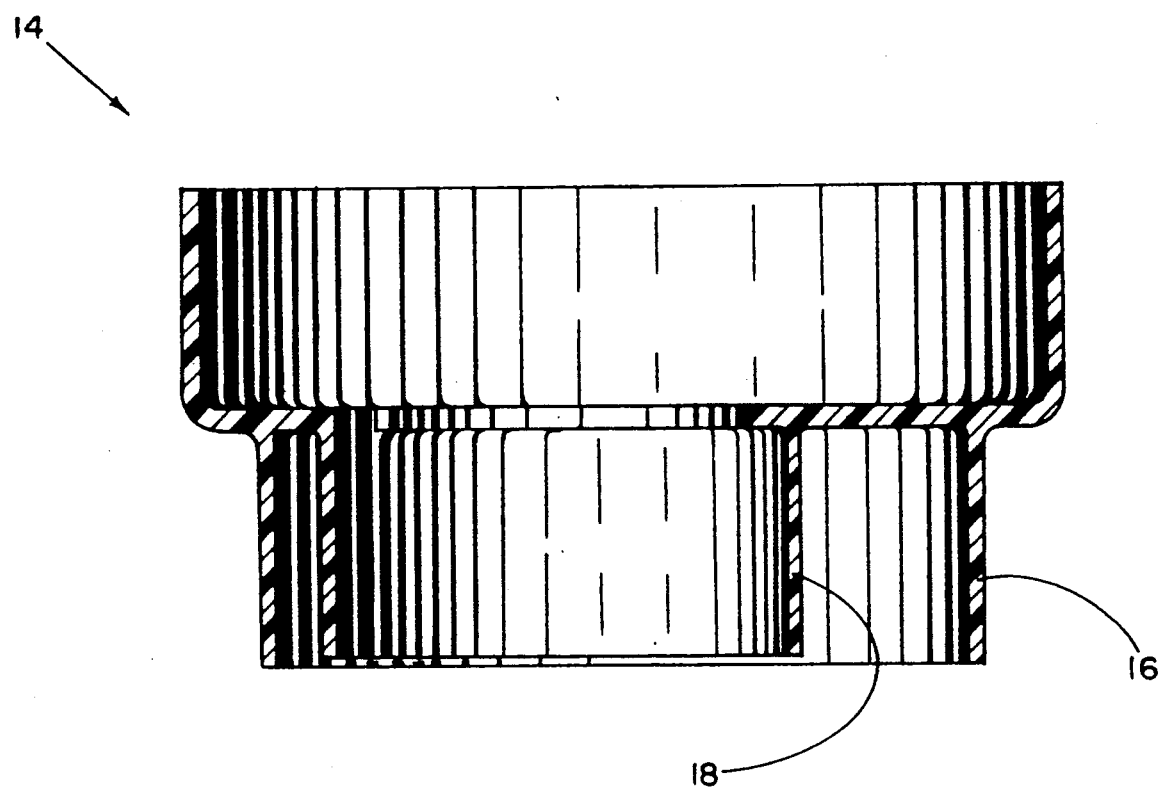

Cover 28 is held on cup shaped member 24 in a leak tight manner through a sealing means 37. Sealing means 37(FIGS. 1, 2, and 3) includes a groove 38 provided in the outer periphery of the cup shaped member, a sealing ring 40 carried in the groove, and a rib 42 extending from cover 28. Groove 38 is formed by an inner wall 29 and outer wall 31 of the cup shaped member. A slot 17 is formed in the inner wall which engages a tab 15 formed on rib 42 to maintain proper alignment of the cover. As shown rib 42 extends into groove 38 to its base 43 such that there is an interference fit between the rib and the sealing ring to apply pressure against the sealing ring to squeeze it between the wall of the groove and rib 42 to thus form a leak tight seal between cover 28 and cup shaped member 24. Sealing ring 40 is preferably a QUAD ring manufactured by Minnesota Rubber Co., Minneapolis, Minn.

There are two openings, one 44 in cup shaped member 24 and another 46 in cover 24 into which shouldered plugs 48 and 50 can be inserted. Each of the plugs carries lead wires 52 and 54 which can be electrically connected to circuit board 34 through terminals 56 and 58. Lead wires 54 can be extended through conduit 20 through feed line 22 to a probe sensor. Lead wires 52 can be fed to a controller through a conduit 53 which functions in accordance with data received from the probe sensor through circuit board 34. As shown, each of the plugs have grooves 60 and 62 into which E-rings 64 and 66 can be forced to retain the shouldered plugs axially. The shoulders of the plugs limit passage one way while the E rings limits their withdrawal. The plugs are made leak tight through QUAD sealing rings 65 and 67 carried in grooves 62 and 60 of the plugs. In order to insure proper alignment of terminals 56 and 58 with circuit board 34, detent means 68 (one shown) are provided. Detent means 68 includes a flat 70 on cap 72 of the plug which mates with tab 74 extending from cup shaped member 24.

Another plug 76 is threaded into sleeve 78 extending from opening 80. A pair of oppositely disposed ears 75 aid in threading the plug into the sleeve. Plug 76 has a window 82 through which the element (s) of circuit board 34 can be seen. In the present embodiment a diode 59 is viewed through the window. The plug is likewise sealed by a Quad sealing ring 73 carried in groove 77.

A hollow post 21 extends from base 23 of cup shaped member 24, the post extending through aperture 19 of cover 28. The post is leak tightly seal through a Quad ring 25. A cable (not shown) may be fed through the hollow post to lower the housing to a desired depth below a surface.

The cup shaped member and the cover are fabricated from a material that is resistant to chemicals, weather and rough handling. A material known as "RYTON", specifically "RYTON" R-7 produced by Phillips Chemical Co. has been found to be suitable.

What is claimed is:

1. A housing assembly for electrical components comprising:
    a housing including a cup shaped member having an open end and a cover closing same,
    a groove around the outer periphery of said cup shaped member, a sealing ring carried in said groove, a rib extending from said cover engaging said groove and forming an interference fit between said rib and said sealing ring applying pressure to said sealing ring forming a leak tight seal between said cup shaped member and said cover,
    seating means carried in the cup shaped member carrying electrical components,
    first and second openings in said housing permitting lead wires to be fed to and from said electrical components, a third opening in said housing permitting said electrical components to be viewed from outside said housing,
    a hollow center post extending through said cup shaped member, and
    an adapter including connecting means permitting said housing to be connected to either of two conduits of different diameters.

2. A housing assembly according to claim 1 wherein said connecting means attaches to said cup shaped member several sleeves of different diameters for accepting different diameter conduits.

3. A housing assembly according to claim 1 wherein said seating means includes a plurality of posts extending from a base of said cup shaped member.

4. A housing assembly according to claim 1 wherein said rib extends to a base of said groove so as to form said interference fit.

5. A housing assembly according to claim 1 wherein said first opening is in said cup shaped member and said second and third openings are in said cover.

6. A housing assembly according to claim 1 wherein said lead wires are permitted to be fed through plugs sealed in said first and second openings.

7. A housing assembly according to claim 6 wherein each of said first and second plugs include a groove to receive an E-ring to secure said plugs from axial movement.

8. A housing assembly for electrical components comprising:
    a housing including a cup shaped member having an open end and a cover closing same,
    a groove around the outer periphery of said cup shaped member, a sealing ring carried in said groove, a rib extending from said cover engaging said groove and forming an interference fit between said rib and said sealing ring to apply pressure to said sealing ring to form a leak tight seal between said cup shaped member and said cover,
    seating means carried in the cup shaped member carrying electrical components,
    first and second openings in said housing permitting lead wires to be fed to and from said electrical components, a third opening in said housing permitting said electrical components to be viewed from outside said housing, and
    an adapter including connecting means attaching to said cup shaped member several sleeves of different diameters for accepting different diameter conduits.

* * * * *